United States Patent [19]

Blum

[11] Patent Number: 4,476,431

[45] Date of Patent: Oct. 9, 1984

[54] SHIFT REGISTER LATCH CIRCUIT MEANS CONTAINED IN LSI CIRCUITRY CONFORMING TO LEVEL SENSITIVE SCAN DESIGN (LSSD) RULES AND TECHNIQUES AND UTILIZED AT LEAST IN PART FOR CHECK AND TEST PURPOSES

[75] Inventor: Arnold Blum, Gechingen, Fed. Rep. of Germany

[73] Assignee: International Business Machines Corporation, Armonk, N.Y.

[21] Appl. No.: 264,995

[22] Filed: May 18, 1981

[30] Foreign Application Priority Data

Aug. 7, 1980 [DE] Fed. Rep. of Germany ....... 3029883

[51] Int. Cl.³ .................... G01R 15/12; H03K 3/284
[52] U.S. Cl. ............................ 324/73 R; 307/272 A; 371/25
[58] Field of Search ....................... 324/73 R, 73 AT; 307/272 A; 371/25, 227

[56] References Cited

U.S. PATENT DOCUMENTS

| | | | |
|---|---|---|---|
| 3,239,764 | 3/1966 | Verna et al. | 328/37 |
| 3,746,973 | 7/1973 | McMahon, Jr. | 324/51 |
| 3,761,695 | 9/1973 | Eichelberger | 235/153 |
| 3,781,683 | 12/1973 | Freed | 324/158 |
| 3,783,254 | 1/1974 | Eichelberger | 235/152 |
| 3,789,205 | 1/1974 | James | 235/153 |
| 3,803,483 | 4/1974 | McMahon, Jr. | 324/51 |
| 3,806,891 | 4/1974 | Eichelberger et al. | 340/172.5 |
| 3,815,025 | 6/1974 | Jordan | 324/73 |
| 3,961,251 | 6/1976 | Hurley et al. | 324/73 |
| 3,961,252 | 6/1976 | Eichelberger | 324/73 |
| 3,961,254 | 6/1976 | Cavaliere et al. | 324/73 |
| 4,006,492 | 2/1977 | Eichelberger et al. | 357/45 |
| 4,051,352 | 9/1977 | Eichelberger et al. | 364/716 |
| 4,051,353 | 9/1977 | Lee | 364/716 |
| 4,055,754 | 10/1977 | Chesley | 235/302.3 |
| 4,063,078 | 12/1977 | DasGupta et al. | 364/700 |
| 4,063,080 | 12/1977 | Eichelberger et al. | 235/302 |
| 4,071,902 | 1/1978 | Eichelberger et al. | 364/716 |
| 4,074,851 | 2/1978 | Eichelberger et al. | 235/302 |
| 4,140,967 | 2/1979 | Balasubramanian et al. | 324/73 |
| 4,220,917 | 9/1980 | McMahon, Jr. | 324/73 |
| 4,225,957 | 9/1980 | Doty, Jr. et al. | 371/15 |
| 4,244,048 | 1/1981 | Tsui | 371/15 |
| 4,276,488 | 6/1981 | Benedict et al. | 307/272 A |

OTHER PUBLICATIONS

IBM TDB Publication "Power Minimization of LSSD SRLS" by R. C. Flaker et al., vol. 19, No. 8, Jan. 1977, pp. 2951-2952.

"Introduction to an LSI Test System" by M. Correia et al., 14th Design Automation Conference Proceedings, Jun. 20, 21 & 22 1977, New Orleans, La., IEEE Catalog No. 77, CH1216-1C, pp. 460-461.

(List continued on next page.)

Primary Examiner—Gerard R. Strecker
Assistant Examiner—Walter E. Snow
Attorney, Agent, or Firm—Wesley DeBruin

[57] ABSTRACT

LSI circuitry conforming to LSSD rules and techniques usually requires at least a small portion of circuitry used only for check and test purposes.

Figure 2:
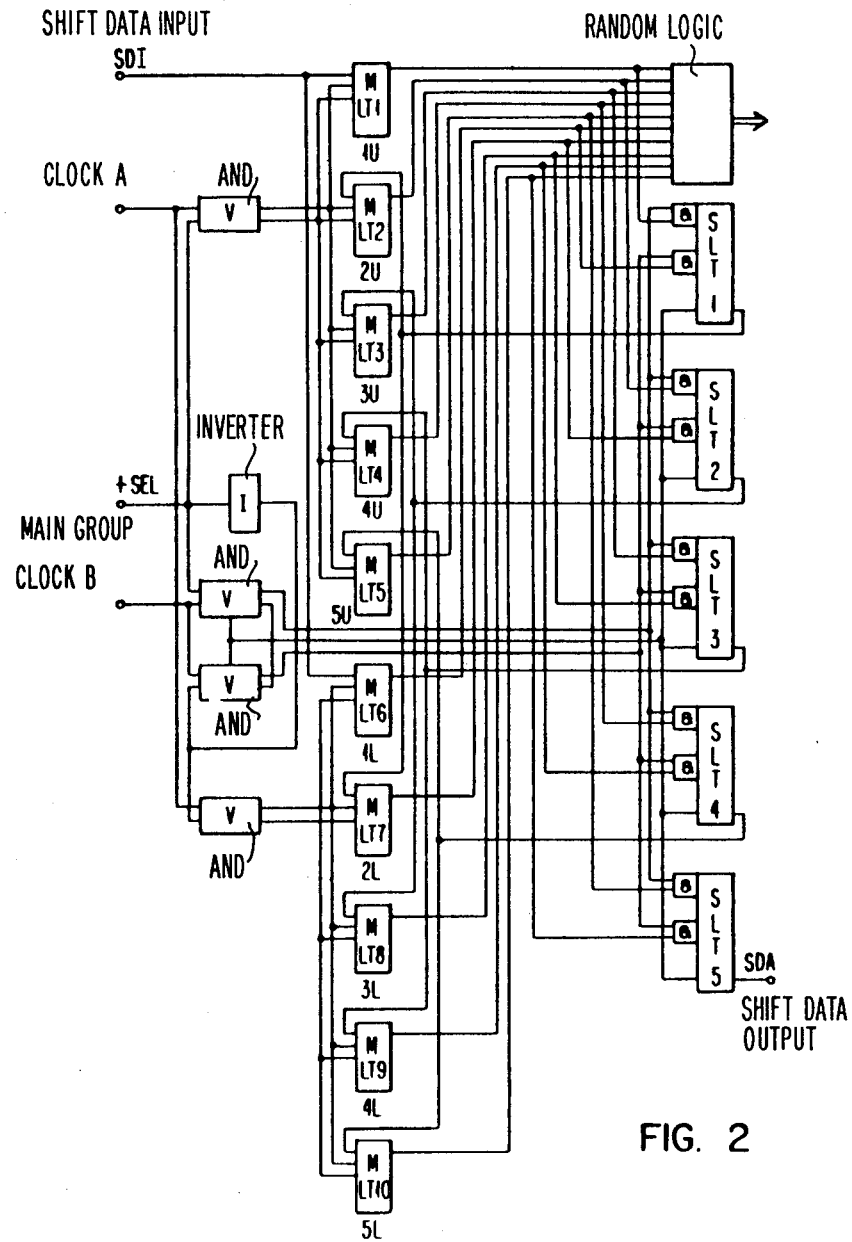

The disclosed circuitry meets the LSSD design rules and techniques and considerably reduces the test circuit overhead. The disclosure modifies the known shift register latch (SRL) strategy by logically removing the master latches from the slave latches and by providing the slave latches with multiple shift inputs, e.g., two shift inputs (FIG. 2). The LSSD shifting philosophy remains unchanged to the extent that at the time of shifting, the virtual (not available slave latch) becomes real (physical) by assigning the only physical slave latch to the respective master latch. The present disclosure provides for multiple master latches to be dynamically assigned to one slave latch during shifting. This is in contrast to the known SRL chain approach requiring one slave latch for each master latch. Level Sensitive Scan Design Rules and Techniques are extensively disclosed in the testing art. See for example (1) U.S. Pat. No. 3,783,254 entitled "Level Sensitive Logic System" filed Oct. 16, 1972, granted Jan. 1, 1974 to E. B. Eichelberger, of common assignee herewith, or; (2) "A Logic Design Structure for LSI Testability" by E. B. Eichelberger and T. W. Williams, 14th Design Automation Conference Proceedings, pages 462-468, June 20, 21 and 22, 1977, New Orleans, Louisiana, IEEE Catalog Number 77, CH1216-1C.

5 Claims, 4 Drawing Figures

OTHER PUBLICATIONS

"A Logic Design Structure for LSI Testability" by E. B. Eichelberger et al., 14th Design Automation Conference Proceedings, Jun. 20, 21 & 22, 1977, New Orleans, La., IEEE Catalog No. 77, CH1216-1C, pp. 462-468.

"Automatic Checking of Logic Design Structures for Compliance with Testability Ground Rules" by H. C. Godoy et al., 14th Design Automation Conference Proceedings, Jun. 20, 21 & 22, 1977, New Orleans, La., IEEE Catalog No. 77, CH1216-1C, pp. 469-478.

"Test Generation for Large Logic Networks" by P. S. Botoroff et al., 14th Design Automation Conference Proceedings, Jun. 20, 21 & 22, 1977, New Orleans, La., IEEE Catalog No. 77, CH1216-1C, pp. 479-485.

"Delay Test Generation" by E. P. Hsieh et al., 14th Design Automation Conference Proceedings, Jun. 20, 21 & 22, 1977, New Orleans, La., IEEE Catalog No. 77, CH1216-1C, pp. 486-491.

"Delay Test Simulation" by T. M. Storey et al., 14th Design Automation Conference Proceedings, Jun. 20, 21 & 22, 1977, New Orleans, La., IEEE Catalog No. 77, CH 1216-1C, pp. 492-494.

"Selective Controllability: L A Proposal for Testing and Diagnosis" by F. Hsu et al., 15th Design Automation Conference Proceedings, Jun. 19, 20 & 21, 1978, Las Vegas, Nevada, IEEE Catalog No. 78 CH 1363-1C, pp. 110-116.

"Testability Considerations in a VLSI Design Automation System" by E. H. Porter (Paper 2.3) 1980 IEEE Test Conference, CH1608-9/80/0000-0026.

"Automatic Test Generation Methods for Large Scale Integrated Logic" by E. R. Jones et al., IEEE Journal of Solid State Circuits, vol. SC-2, No. 4, Dec. 1967, pp. 221-226.

"Techniques for the Diagnosis of Switching Circuit Failures", Proceedings of the 2nd Annual Symposium on Switching Theory and Logical Design, Oct. 1960, pp. 152-160 by J. M. Galey et al.

"Semiconductor Wafer Testing" by D. E. Shultis, IBM Technical Disclosure Bulletin, vol. 13, No. 7, Dec. 1970, p. 1793.

"Automatic System Level Test Generation and Fault Locator for Large Digital Systems" by A. Yamada et al., 15th Design Automation Conference Proceedings, Jun. 19, 20 & 21, 1978, Las Vegas, Nevada, IEEE Catalog No. 78 CH 1363-1C, pp. 347-352.

"LSI Chip Design for Testability" by S. DasGupta et al., 1978 IEEE International Solid-State Circuits Conference, Digest of Technical Papers, Feb. 1978, pp. 216-217.

"Design for Testability of the IBM System/38" by L. A. Stolte, Digest of Papers 1979 IEEE Test Conference (Oct. 23-25, 1979, Cherry Hill, NJ) pp. 29-36.

"Printed Circuit Card Incorporating Circuit Test Register" by E. I. Muehldorf, IBM Technical Disclosure Bulletin, vol. 16, No. 6, Nov. 1973, p. 1732.

"AC Chip In-Place Test" by M. T. McMahon, Jr., IBM Technical Disclosure Bulletin, vol. 17, No. 6, Nov. 1974, pp. 1607-1608.

"Shunting Technique for Testing Electronic Circuitry" by R. D. Harrod, IBM Technical Disclosure Bulletin, vol. 18, No. 1, Jun. 1975, pp. 204-205.

"Interconnection Test Arrangement" by J. D. Barnes, IBM Technical Disclosure Bulletin, vol. 22, No. 8B, Jan. 1980, pp. 3679-3680.

"Single Clock Shift Register Latch" by T. W. Wiliiams, IBM Technical Discloure Bulletin, vol. 16, No. 6, Nov. 1973, p. 1961.

"Trigger Arrays Using Shift Register Latches" by S. DasGupta, IBM Technical Disclosure Bulletin, vol. 24, No. 1B, Jun. 1981, pp. 615-616.

"Logic-Array Isolation by Testing" by P. Goel. IBM Technical Disclosue Bulletin, vol. 23, No. 7A, Dec. 1980, pp. 2794-2799.

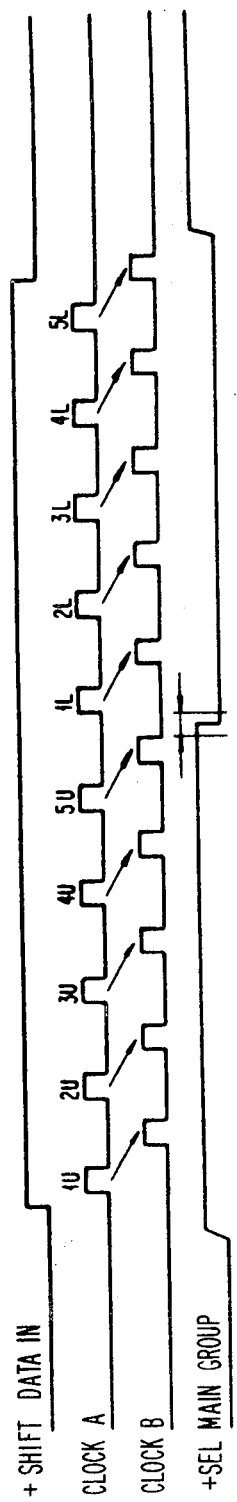
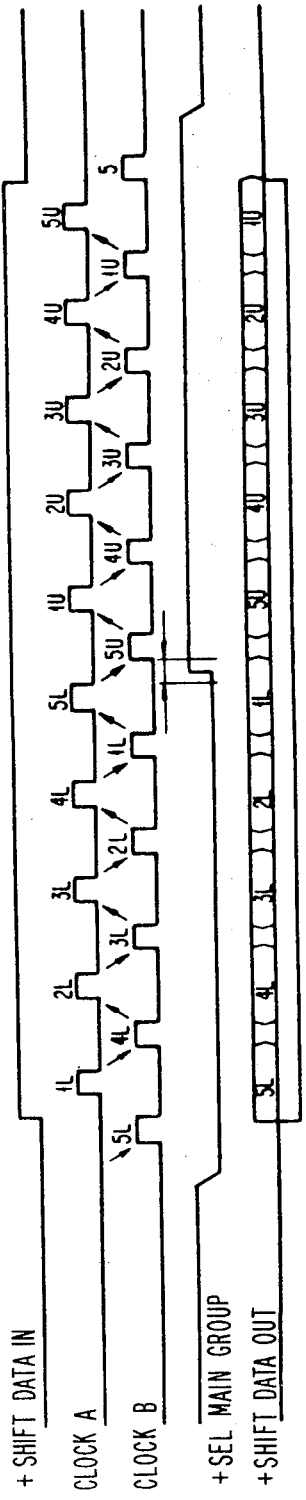

SHIFT REGISTER LATCH CIRCUIT MEANS CONTAINED IN LSI CIRCUITRY CONFORMING TO LEVEL SENSITIVE SCAN DESIGN (LSSD) RULES AND TECHNIQUES AND UTILIZED AT LEAST IN PART FOR CHECK AND TEST PURPOSES

BACKGROUND OF THE INVENTION

1. Field of the Invention

The invention relates to shift register latch circuit means contained in LSI circuitry conforming to LSSD rules and techniques. The shift register latch circuit means is utilized for checking and testing the LSI circuitry.

CROSS-REFERENCE TO RELATED APPLICATIONS

1. U.S. patent application Ser. No. 066,130 entitled "Improved Level Sensitive Scan Design System", filed Aug. 13, 1979 by S. DasGupta et al., of common assignee, granted as U.S. Pat. No. 4,293,919 on Oct. 6, 1981.

2. U.S. patent application Ser. No. 062,932 entitled "Method and Arrangement of Testing Sequential Circuits Represented by Monolithically Integrated Semiconductor Circuits", filed July 26, 1979 by J. Hajdu and G. Knauft, of common assignee, granted as U.S. Pat. No. 4,298,980 on Nov. 3, 1981.

3. U.S. patent application Ser. No. 934,936 entitled "Module Interconnection Testing Scheme", filed Aug. 18, 1978 by Se June Hong, of common assignee, granted as U.S. Pat. No. 4,241,307 on Dec. 23, 1980.

4. U.S. patent application Ser. No. 974,641 entitled "Chip and Wafer Configuration and Testing Method for Large-Scale-Integrated Circuits" filed Dec. 29, 1978 by F. F. Tsui of common assignee, granted as U.S. Pat. No. 4,244,048 on Jan. 6, 1981.

5. U.S. patent application Ser. No. 929,480 entitled "Test Circuitry For Module Interconnection Network" filed July 31, 1978, by M. T. McMahon, Jr., of common assignee, granted as U.S. Pat. No. 4,220,917 on Sept. 2, 1980.

6. U.S. patent application Ser. No. 104,481 filed Dec. 17, 1979 entitled "Module Testing on Testers with Insufficient Channels" by H. D. Schnurmann, of common assignee, granted as U.S. Pat. No. 4,348,759 on Sept. 7, 1982.

7. U.S. patent application Ser. No. 264,896 filed May 18, 1981 entitled "Shift Register Latch Circuit Means for Check and Test Purposes and Contained in LSI Circuitry Conforming to Level Sensitive Scan Design (LSSD) Rules and Techniques" by A. Blum and of common assignee.

As integration progresses, large-scale and very large scale integration, the direct access to a circuit group in a physical unit (e.g., a chip, a module) has become increasingly difficult and restricted. This is attributable to the considerable increase in the number of circuits used in the LSI and VLSI unit as well as to the microscopical dimensions such circuits have. Thus, the testing of such circuits has become one of the main problems during the manufacture of highly integrated circuits.

The testing of an LSI and VLSI unit is further aggravated by the presence of inaccessible storage elements and latch circuits which are generally embedded along with the logical combinational networks. As it is impossible to test and check the logical states of these embedded latches, it is equally impossible to test the appertaining logical networks. In spite of this, it is not possible to do without a reliable and thorough test of the various LSI and VLSI components and units during manufacture and operation.

A number of U.S. patents discussed below concern a system design method and discipline, or rules and techniques, meeting the above requirements. These rules and techniques all come under the title "LSSD" (Level Sensitive Scanning Design). A feature all of these known solutions have in common is that a built-in circuit is required for each LSI unit, by means of which the logical state of the unit is explicitly tested in full and/or is tested at a limited number of I/O pins, using particular I/O methods. These requirements can be met by arranging for each latch of the logical system in the unit to be associated with shift register latches and by subsequently combining or organizing these shift register latches (SRLs) in the form of one or several shift register data channels, the I/O stages of which are accessible from the outside.

Detailed operation by means of this SRL arrangement wherein each shift register latch (SRL) comprises a master latch and a slave latch for different test requirements are expressly set out and specified in U.S. Pat. No. 3,761,695, FIGS. 7 to 9 of U.S. Pat. No. 3,784,907 and a number of other U.S. patents and publications fully identified hereinafter.

The most important requirements may be summarized as follows: In the test mode, particular logical test patterns required, are serially entered and subsequently shifted to the appropriate latch positions if the unit is operated in the shift mode, i.e., by inhibiting the system clock and by triggering the shift clock pulse to the unit. As a result, the latch states of the individual circuits supply the pulses required for testing the appertaining logical networks. Then the test patterns are passed on through the networks by implementing one or several steps of the function mode, i.e., by normal system clock energization. As a function of particular states in the design of the system, which often replace the test patterns originally entered, the response patterns of the logical networks to the pulses applied are latched by the system latches in a known manner. For testing, the system returns to the shift mode, issuing the response patterns. By means of the conventional shift registers, which are generally used in practice for SRLs, it is possible to check and test at the expense of the hardware, which in certain cases is rather uneconomical. This is largely due to the fact that to each system latch a second latch has to be added, permitting the former to function as an SRL circuit. Namely, each SRL is comprised of a master latch and a slave latch.

In view of this, conventional shift registers use two latches (a master and slave) for each shift register latch (SRL) stage. Shifting in and shifting out operations are effected by the parallel application of a two-phase clock sequence. (For example, an A-clock and a B-clock are provided).

The shift register featured in U.S. Pat. No. 3,783,254 uses two DC latch circuits (a master latch circuit and a slave latch circuit) for each shift register latch stage. Shifting in and shifting out is effected by a two-phase clock system (A-clock and B-clock) which is applied in parallel to a first (master) and a second (slave) latch circuit of each (SRL) stage of the shift register.

To reduce the expenditure incurred by the double latch circuits, No. GE-OS 2 723 594 proposes a shift register for check and test purposes which, while having the same function as known registers, necessitates only half as many latch circuits. [GE-OS No. 2723594 corresponds to U.S. Pat. No. 4,051,353 entitled "Accordion Shift Register and Its Application In the Implementation of Level Sensitive Logic System" granted Sept. 27, 1977 to Hua-Tung Lee and of common assignee herewith]. For this purpose, a latch circuit is associated with each circuit or each circuit group for a particular logical function or storage function. The latch circuits forming stages of the shift register, at the input of which check and test information is received. At the output of the shift register particular bit patterns are emitted as a function of the check and test information entered as well as of the state of the integrated circuit to be tested. As a function of a shift clock control, A- and B- pulses alternately increment the latch circuits in a shift register forming a test channel. This activates the different latch circuits at a clock time (A or B) either once or several times. As a result, the information in the shift register is compressed and then decompressed, i.e., pulled apart in the manner of an accordion.

The solution, set forth in U.S. Pat. No. 4,051,353, still uses a relatively high proportion of slave circuits, namely, fifty per cent in relation to the master circuits. In addition, its line structure and control are extensive.

BACKGROUND ART

The following patents and publications are directed to the testing of electronic structures. A number of these patents and publications further disclose LSSD testing arrangements and organizations. It is to be appreciated, with reference to the subject invention, that the following art is not submitted to be the only prior art, the best prior art, or the most pertinent prior art.

Patents:

U.S. Pat. No. 4,071,902 entitled "Reduced Overhead for Gated B Clock Testing" granted Jan. 31, 1978 to E. B. Eichelberger and T. W. Williams and of common assignee.

U.S. Pat. No. 4,051,353 (Ser. No. 701,055) entitled "Implementation of Level Sensitive Logic System Employing Accordion Shift Register Means" granted Sept. 27, 1977 to Hua-Tung Lee and of common assignee herewith.

U.S. Pat. No. 3,961,252 (Ser. No. 534,606) entitled "Testing Embedded Arrays" granted June 1, 1976 to E. B. Eichelberger and of common assignee herewith.

U.S. Pat. No. 3,961,254 (Ser. No. 534,608) entitled "Testing Embedded Arrays" granted June 1, 1976 to J. R. Cavaliere et al. and of common assignee herewith.

U.S. Pat. No. 3,961,251 (Ser. No. 534,605) entitled "Testing Embedded Arrays" granted June 1, 1976 to W. P. Hurley et al., and of common assignee herewith.

U.S. Pat. No. 4,063,080 entitled "Method of Propagation Delay Testing A Level Sensitive Embedded Array Logic System", filed June 30, 1976, granted Dec. 13, 1977 to E. B. Eichelberger, E. I. Muehldorf, R. G. Walther and T. W. Williams and of common assignee.

U.S. Pat. No. 4,051,352 entitled "Level Sensitive Embedded Array Logic System", filed June 30, 1976, granted Sept. 27, 1977 to E. B. Eichelberger, E. I. Muehldorf, R. G. Walther and T. W. Williams and of common assignee.

U.S. Pat. No. 3,789,205 entitled "Method of Testing MOSFET Planar Boards" granted Jan. 29, 1974 to R. L. James and of common assignee.

U.S. Pat. No. 4,006,492 entitled "High Density Semiconductor Chip Organization" filed June 23, 1975, granted Feb. 1, 1977 to E. B. Eichelberger and G. J. Robbins and of common assignee.

U.S. Pat. No. 4,063,078 entitled "Clock Generation Network" filed June 30, 1976 granted Dec. 13, 1977 to E. B. Eichelberger and S. Das Gupta and of common assignee.

U.S. Pat. No. 3,783,254 entitled "Level Sensitive Logic System" filed Oct. 16, 1972, granted Jan. 1, 1974 to E. B. Eichelberger and of common assignee.

U.S. Pat. No. 3,761,695 entitled "Method of Level Sensitive Testing A Functional Logic System" filed Oct. 16, 1972, granted Sept. 25, 1973 to E. B. Eichelberger and of common assignee.

U.S. Pat. No. 3,784,907 entitled "Method of Propagation Delay Testing A Functional Logic System" filed Oct. 16, 1972 granted Jan. 8, 1974 to E. B. Eichelberger and of common assignee.

U.S. Pat. No. 3,746,973 entitled "Testing of Metallization Network on Insulative Substrates Supporting Semiconductor Chips" granted July 17, 1973 to M. T. McMahon, Jr., and of common assignee.

U.S. Pat. No. 3,781,683 entitled "Test Circuit Configuration For Integrated Semiconductor Circuits and a Test System Containing Said Configuration" granted Dec. 25, 1973 to L. E. Freed and of common assignee.

U.S. Pat. No. 3,803,483 entitled "Semiconductor Structure For Testing of Metallization Networks on Insulative Substrates Supporting Semiconductor Chips" granted Apr. 9, 1974 to M. T. McMahon, Jr. and of common assignee.

U.S. Pat. No. 3,815,025 entitled "Large-Scale Integrated Circuit Testing Structure" granted June 4, 1974 to P. V. Jordan and of common assignee.

U.S. Pat. No. 4,055,754 entitled "Memory Device and Method of Testing the Same" granted Oct. 25, 1977 to G. D. Chesley.

U.S. Pat. No. 4,225,957 entitled "Testing Macros Embedded in LSI Chips" granted Sept. 30, 1980 to C. R. Doty, Jr., et al., and of common assignee.

U.S. Pat. No. 4,140,967 entitled "Merged Array PLA Device, Circuit, Fabrication Method and Testing Technique" granted Feb. 20, 1979 to P. S. Balasubramanian et al., and of common assignee.

U.S. Pat. No. 4,220,917 entitled "Test Circuitry For Module Interconnection Network" granted Sept. 2, 1980 to M. T. McMahon, Jr., and of common assignee.

U.S. Pat. No. 4,074,851 entitled "Method of Level Sensitive Testing A Functional Logic System with Embedded Array" granted Feb. 21, 1978 to E. B. Eichelberger and of common assignee.

U.S. Pat. No. 3,806,891 entitled "Logic Circuit For SCAN-IN/SCAN-OUT" granted Apr. 23, 1974 to E. B. Eichelberger et al., and of common assignee.

U.S. Pat. No. 4,244,048 entitled "Chip and Wafer Configuration and Testing Method for Large-Scale-Integrated Circuits" granted Jan. 6, 1981 to F. F. Tsui and of common assignee.

Publications:

"Introduction to An LSI Test System" by M. Correia and F. B. Petrini, 14th Design Automation Conference Proceedings", June 20, 21 and 22, 1977, New Orleans, La., IEEE Catalog Number 77, CH 1216-1C, pages 460-1.

"A Logic Design Structure For LSI Testability" by E. B. Eichelberger and T. W. Williams, 14th Design Automation Conference Proceedings, June 20, 21 and 22, 1977, New Orleans, La., IEEE Catalog Number 77, CH 1216-1C, pages 462-8.

"Automatic Checking of Logic Design Structures For Compliance with Testability Ground Rules" by H. C. Godoy, G. B. Franklin and P. S. Bottoroff, 14th Design Automation Conference Proceedings, June 20, 21 and 22, 1977, New Orleans, La., IEEE Catalog Number 77, CH 1216-1C, pages 469-478.

"Test Generation For Large Logic Networks" by P. S. Botoroff, R. E. France, N. H. Garges and E. J. Orosz, 14th Design Automation Conference Proceedings, June 20, 21 and 22, 1977, New Orleans, La., IEEE Catalog Number 77, CH 1216-1C, pages 479 to 485.

"Delay Test Generation" by E. P. Hsieh, R. A. Rasmussen, L. J. Vidunas and W. T. Davis, 14th Design Automation Conference Proceedings, June 20, 21 and 22, 1977, New Orleans, La., IEEE Catalog Number 77, CH 1216-1C, pages 486 to 491.

"Delay Test Simulation" by T. M. Storey and J. W. Barry, 14th Design Automation Conference Proceedings, June 20, 21 and 22, 1977, New Orleans, La., IEEE Catalog Number 77, CH 1216-1C, pages 492 to 494.

"Selective Controllability: A Proposal For Testing and Diagnosis" by F. Hsu, P. Solecky and L. Zobniw, 15th Design Automation Conference Proceedings, June 19, 20 and 21, 1978, Las Vegas, Nev., IEEE Catalog Number 78 CH 1363-1C, pages 110-116.

"Testability Considerations in A VLSI Design Automation System" by E. H. Porter (Paper 2.3) 1980 IEEE Test Conference, CH 1608-9/80/0000-0026.

"Automatic Test Generation Methods For Large Scale Integrated Logic" by E. R. Jones and C. H. Mays, IEEE Journal of Solid-State Circuits, Vol. SC-2, No. 4, December 1967, pages 221-226.

"Techniques For The Diagnosis of Switching Circuit Failures", Proceedings of the 2nd Annual Symposium on Switching Theory and Logical Design, October 1960, pages 152-160.

"Semiconductor Wafer Testing" by D. E. Shultis, IBM technical Disclosure Bulletin, Vol. 13, No. 7, December 1970, page 1793.

"Automatic System Level Test Generation and Fault Locator For Large Digital Systems" by A. Yamada et al., 15th Design Automation Conference Proceedings, June 19, 20 and 21, 1978, Las Vegas, Nev., IEEE Catalog Number 78 CH 1363-1C, pages 347-352.

"LSI Chip Design for Testability" by S. Das Gupta et al., 1978 IEEE International Solid-State Circuits Conference, Digest of Technical Papers February 1978, pages 216 and 217.

"Design For Testability of the IBM System/38" by L. A. Stolte, Digest of Papers 1979 IEEE Test Conference (Oct. 23-25, 1979, Cherry Hill, N.J.) pages 29-36.

"Printed Circuit Card Incorporating Circuit Test Register" by E. I. Muehldorf, IBM Technical Disclosure Bulletin, Vol. 16, No. 6, November 1973, page 1732.

"AC Chip In-Place Test" by M. T. McMahon, Jr., IBM Technical Disclosure Bulletin, Vol. 17, No. 6, November 1974, pages 1607-08.

"Shunting Technique For Testing Electronic Circuitry" by R. D. Harrod, IBM Technical Disclosure Bulletin, Vol. 18, No. 1, June 1975, pages 204-05.

"Interconnection Test Arrangement" by J. D. Barnes, IBM Technical Disclosure Bulletin, Vol. 22, No. 8B, January 1980, pages 3679-80.

"Single Clock Shift Register Latch" by T. W. Williams, IBM Technical Disclosure Bulletin, Vol. 16, No. 6, November 1973, page 1961.

"Trigger Arrays Using Shift Register Latches" by S. Das Gupta IBM Technical Disclosure Bulletin, Vol. 24 No. 1B, June 1981 pages 615-616.

"Logic-Array Isolation by Testing" (FI 8-79-0474) by P. Goel, IBM Technical Disclosure Bulletin, Vol. 23, No. 7A, December 1980, pages 2794-2799.

SUMMARY OF THE INVENTION

Therefore, it is an object of the invention to provide a shift register for check and test purposes on storage and logic chips which requires fewer slave circuits and which, in addition, has a simpler line structure than hitherto known registers.

The solution in accordance with the invention may be summarized as set-forth in the following numbered paragraphs.

No. 1: Shift register latch circuit means comprised of latch circuits and contained on an integrated circuit logic or storage chip for check and test purposes, data in said shift register circuit means being shifted by means of A- and B-clocks, said shift register latch circuit means including a plurality of main latch circuits and a plurality of auxiliary latch circuits, said plurality of main latch circuits and said plurality of auxiliary latch circuits being formable into a first subchain comprised of a plurality of shift register latch stages, or a second subchain comprised of a plurality of shift register latch stages, each individual shift register latch stage consisting of one main latch circuit and one auxiliary latch circuit, said shift register latch circuit means being characterized in:

that the main latch circuits (MLT1 to MLT10) present in said shift register latch circuit means are selected in main groups by selection signals (+SEL main group) on a corresponding line, that for the purpose of shifting in, shifting, or shifting out of data, at the time of shifting, auxiliary latch circuits (SLT1 to 5) are physically associated with the main latch circuits (MLT) of the selected group forming said first subchain, comprised of said plurality of shift register latch stages, while the non-selected groups of main latch circuits (MLT) form a chain of virtual storage stages.

No. 2: Shift register latch circuit means, in accordance with numbered paragraph 1, supra, further characterized in that the shift clocks (A and B) are applied in groups to the main latch circuits (MLT) and to the auxiliary latch circuits via logic circuits (I and V), (wherein the symbol "I" represents an Inverter circuit and symbol "V" represents an AND circuit), that the shift data input line (SDI) is also connected to the respective first main latch circuit (MLT1 and MLT6), of each of said groups that the output of each main latch circuit (MLT1 to MLT10) is connected to a random logic circuit means and to inputs of two input AND circuits preceding the auxiliary latch circuits (SLT1 to SLT5) and the other inputs of said AND circuits preceding said latch circuits being connected to lines carrying clock and selection signals; and that the outputs of all but one of the auxiliary latch circuits (SLT1 to SLT4) are respectively connected to a distinct one main latch circuit (MLT) in each group of main latch circuits of said shift register latch circuit means.

No. 3: Shift register latch circuit means in accordance with numbered paragraph 2, supra, further characterized in that the output of at least one of the auxiliary circuits (SLT5) is designed as a shift data output (SDA) of the shift register latch circuit means.

No. 4: Shift register latch circuit means in accordance with numbered paragraph 1, 2 or 3, supra, further characterized in
that during the byte-by-byte shifting of data in the shift register latch circuit means each main latch circuit group has a number of main latch circuits (MLT) corresponding to the number of binary bits in one byte of data.

No. 5: Shift register latch circuit means in accordance with numbered paragraph 1, 2, 3 or 4 supra, further characterized in
that the data flow register auxiliary latch circuits (SLT) are preceded by multiplex input switches.

As the slave (or auxiliary) latch circuits are logically separated from the master latch circuits, and the slave latch circuits are respectively provided with several shift and data inputs, it is possible at a given time to dynamically associate the physically present slave latch circuits with the master latch circuits of a particular group of a plurality of groups of master latch circuits included in the shift register latch circuit means. Thus, for each master latch circuit there is, as it were, one imaginary slave latch circuit, although, in actual fact, the semiconductor chip comprises only one slave latch circuit for a plurality of master latch circuits. For example, as will be more fully apparent from the detailed description of the invention set-forth hereinafter, m groups of master latches may respectively be associated at different instances in time with a single group of slave (or auxiliary) latches, where each group of master latches has n master latches, said group of slave latches has n slave latches and m and n are respectively positive integer numbers. It will be appreciated that the value of m in particular, and also n will be limited only by practical considerations, such as wiring, etc. The solution, in accordance with the invention, leads to a considerable reduction in the number of slave latch circuits and control lines required. The savings in semiconductor chip space may be used to advantage for the fabrication of additional storage circuits or logic circuits. This is of particular advantage if a complete microprocessor is to be arranged on only one chip where the space available is extremely limited. The test functions and times are not limited by this concept either, so that the semiconductor chip can be tested and checked in full.

Figure 1:
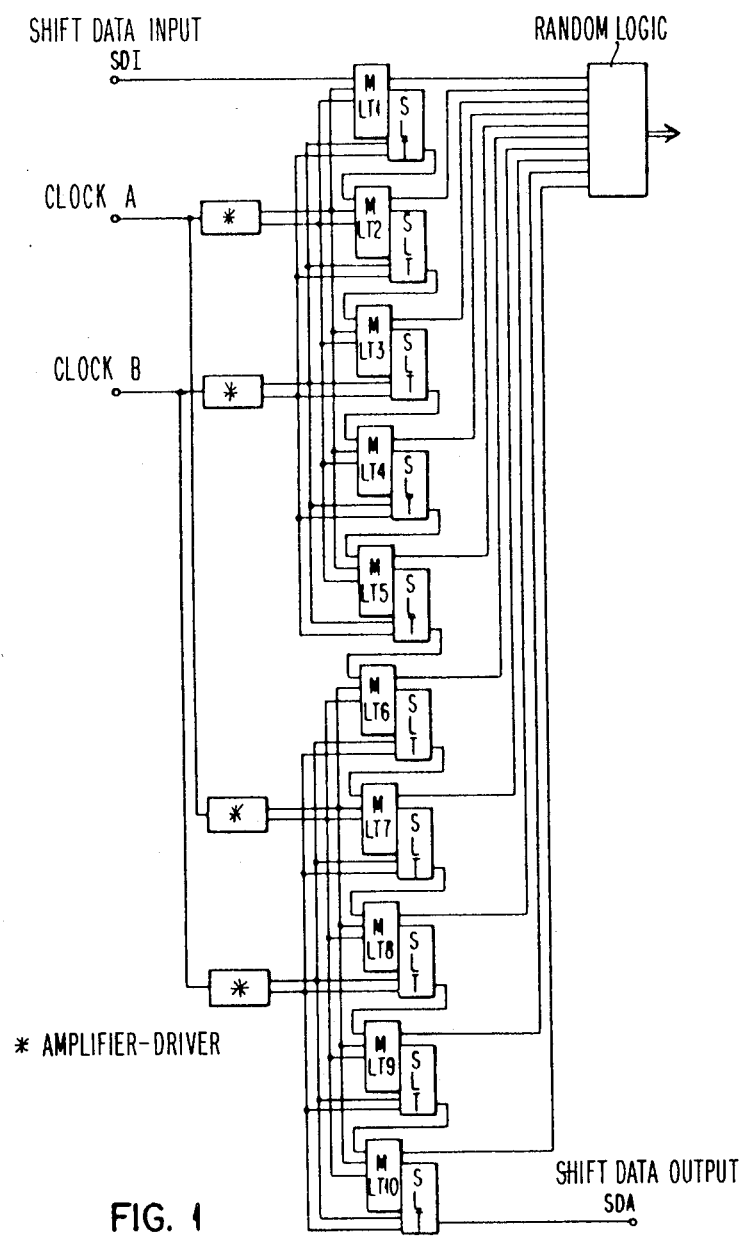

The invention will be described in detail below by means of embodiments shown in the drawings, in which FIG. 1 is a known shift register having a plurality of shift register stages and each shift register stage includes a master latch and a slave latch;

FIG. 2 is shift register latch circuit means, in accordance with the invention, wherein each physical slave latch circuit may be associated at a given instance in time with a particular one of a plurality of master latch circuits; and FIGS. 3 and 4 are time diagrams showing the operation of the shift register latch circuit means in accordance with the invention and FIG. 2.

The shift register illustrated in FIG. 1 is a known shift register which is used for testing, checking and other logical operations. The shift register latch circuit of FIG. 1 may be directly arranged on a logic semiconductor chip or on a storage chip. The shift register stages of this shift register consist of a master latch circuit MLT and an associated slave latch circuit SLT. This ensures that no data are lost during shifting and that test operations can be performed satisfactorily. [The shift register of FIG. 1 contains ten shift register latch (SRL) stages. Each SRL stage including a master latch and a slave latch. A source of B-clock signals connected to the ten slave latch circuits and a source of A-clock signals connected to said master latch circuits. Shift registers, employing shift register latch (SRL) circuitry, generally of the type disclosed in FIG. 1 are known in the prior art to be employed in integrated circuit chips, integrated circuit devices and structures (logic and memory) designed in accordance with the Level Sensitive Scan Design (LSSD) rules.]

During the shifting out of stored binary information from a stage, the slave latch (SLT) is set by means of a clock B signal to receive the information from the preceding master latch (MLT). Subsequently this information may be transferred by means of a clock A signal to the next connected master latch circuit (MLT). As a result, the slave latch circuit (SLT) is only a means for shifting information out of the master latch circuit (MLT). The master latch circuit (MLT) is controlled by means of the shift clock A. The data are applied to the input line (SDI) to be shifted into the shift register and may be shifted out via output line (SDA). The random logic connected to the master latch circuit (MLT) of each stage of the shift register permits the storage state to be evaluated and can, for example, be tested.

FIG. 2 shows shift register latch circuit means in accordance with the invention and includes master latch circuits (MLT) and slave latch circuits (SLT). A difference between the shift register latch circuit means of FIG. 2 and the shift register shown in FIG. 1 is that the master latch circuits (MLT) and the slave latch circuits (SLT) are not permanently associated with each other. As a result fewer slave latch circuits (SLT) than master latch circuits (MLT) are required, i.e., are available as shift register latch stages in the shift register latch circuit means. In the illustrative example, five slave latch circuits, SLT1 to SLT5, are associated with ten master latch circuits MLT1 to MLT10. Also, the slave latch circuits SLT1 to SLT5 are provided with two shift data inputs. Each slave latch circuit (SLT1 to SLT5) is preceded by two AND circuits (&).

To dynamically associate the five slave latch circuits (SLT1 to SLT5) with the ten master latch circuits (MLT1 to MLT10), the master latch circuits are subdivided into two groups. In FIG. 2, the two groups of master latch circuits are respectively, master latch circuits MLT1, MLT2, MLT3, MLT4 and MLT5 and master latch circuits MLT6, MLT7, MLT8, MLT9 and MLT10. It is to be appreciated that the actual number of master latches and slave latches may be other than ten and five which were chosen for facility of explanation. For example, it is possible to use another number of master latch circuits, such as twenty-four and six, eight or twelve slave latch circuits. For example, m master latch circuits may be divided into k groups of master latch circuits which may be respectively operative in conjunction with n slave latch circuits where m, n and k are positive integers and $m = kn$. (For example, take m as 36, then k may be 4, 6, 9, 12 or 18 and n will be 9, 6, 4, 3 and 2 respectively).

In FIG. 2, the master latch circuits MLT1 through MLT10 are subdivided into two groups (L), 1L, 2L, 3L, 4L ... 5L and (U), 1U, 2U, 3U, 4U, 5U of five master latch circuits each. Of each group, the master latch circuits are respectively associated with the shift data inputs of a slave latch circuit. [That is, each master latch circuit of group U has its output coupled through a first controlled shift data input to a single one of said slave latch circuits and each master latch circuit of group L has its output coupled through a second controlled shift data input to a single one of said slave latch circuits]. Association is effected by the signal +SEL main group activating the relevant shift clocks A and B and one or the other master latch circuit group. This means that at the shift time interval, one or the other of the two master latch circuit groups, each consisting of five master latch circuits, is associated (selected) with the five slave latches. Thus, at the shift time interval such a group of master latch circuits (U) together with the five slave latch circuits (SLT1 to SLT5) forms a shift chain (or shift register) corresponding to the design principle of a known shift chain (or shift register) in accordance with FIG. 1. This is true since from a circuit standpoint one slave latch circuit is associated with each master latch circuit at the shift time interval. At the latter interval each master latch circuit has a physically present slave latch circuit, thus temporarily forming a shift register latch (SRL) stage as shown in FIG. 1. As a result, a subchain (or shift register) operating in accordance with known shift laws is formed in the shift register latch circuit means of FIG. 2. In contrast to this, the other (unselected) group of master latch circuits MLT (L) forms a chain of virtual storage stages at the time interval mentioned, as at that time the five slave latch circuits are not physically available for said (unselected) group.

When the group signal +SEL main group selects the other five master latch circuits (L), i.e., the previous unassociated (unselected) group (L) of master latch circuits, the previously (selected) group (U) forms the virtual storage stages. By using several group signals, which may also be applied in a coded form, and by suitably designing the slave latch circuits SLT to comprise several shift data inputs, the master latch circuits MLT may be subdivided into more than two groups.

The circuit savings thus obtained are significant, particularly with highly integrated chips. As a result, it is possible to save silicon area on the chip and to reduce the power dissipation for a particular given function to be implemented.

FIG. 3 shows a time diagram for the shift operation which can be effected by means of the shift register latch circuit means of FIG. 2. For simplicity's sake the time diagram shows only the shift processes. It does not show the setting of the master latch circuits MLT during the logical function mode.

FIG. 3 initially shows the shifting in of binary ones into the ten master latch circuits, MTL. For this purpose, the signal shift data in is set to "one" (binary one) on line SDI of the shift register latch circuit means of FIG. 2. Prior to shifting, the signal +SEL main group is also set to "one" to select the upper master latch group, U, of five master latch circuits, MLT, (FIG. 2) and to associate them with the five slave latch circuits SLT. After five shift clock pairs A/B, the 1, 1, 1, 1, 1 information (respectively binary ones) has been shifted into all master latch circuits of the upper group U. The fifth shift clock B transfers only the information of the master latch circuits to their corresponding slave latch circuits, which may also be referred to as the don't care function during the shifting.

Subsequently, the signal +SEL main group is switched, and the shift operation for the lower group L consisting of the master latch circuits MLT6 to MLT10 can be performed in the same manner.

FIG. 4 shows the shifting of data from the master latch circuits while data are shifted into the empty master latch circuits. Subsequently, the binary values stored in the master latch circuits appear in the illustrated order at the output SDA of the shift register latch circuit means of FIG. 2, i.e., first the lower master latch circuit group L and then the upper master latch circuit group U.

At the same time, information (in this case a "one") is, as it were, shifted through the input SDI of the shift register latch circuit means of FIG. 2 into the empty master latch circuits (of the same group) in the reverse order. For shifting in a binary zero, the line SDI must be controlled by means of signal SDI at the respective shift times. The master latch circuit group to be shifted is defined by the signal +SEL main group and thus selected. When the shift clocks A/B are inactive (e.g., in the logical function mode) the signal +SEL main group is inactive, too, and thus can be "one" or "zero". For explaining the shift operation, the controlled master latch circuits of the individual groups which correspond to the designation in FIG. 2 are indicated in FIGS. 3 and 4 at clocks A and B.

A further development of the inventive principle consists in highly integrated chips for macro stacks of logical, physical or application-related data flow register latches including their preceding multiplex input switches. It is also possible for one slave latch circuit each to be associated with master latch circuits of n bytes each of 9 bits, if data are shifted by bytes. In such a case one master latch circuit group is formed by one byte each.

While the invention has been described and shown particularly with reference to one of its preferred embodiments, it will be understood by those skilled in the art to which the work is directed that various changes in form and in detail may be made without departing from either the spirit or scope of the invention.

I claim:

1. In a functional logic unit for performing at least one logical function, said functional logic unit including shift register latch circuit means, said shift register latch circuit means comprising:

m master latch circuits, each master latch circuit having an input and an output, where m is a positive integer;

said m master latch circuits being interconnected into k groups of master latch circuits;

n slave latch circuits, each slave latch circuit having an input and an output, where n is a positive integer and m=kn; and controllable circuit means interconnecting each of said k groups of master latch circuits with said n slave latch circuits for forming any one of k shift registers at a given instant in time, and wherein each one of said k shift registers includes a distinct one of said k groups of master latch circuits interconnected with said n slave latch circuits, each one of said k shift registers having n shift register stages, an input, and an output and where each of said n shift register stages is a shift register latch consisting of a master latch circuit and one of said n slave latch circuits.

2. In an integrated circuit device, test circuit means for at least assisting in the testing of said integrated circuit device, said test circuit means comprising shift register latch circuit means including:

a first group of one through n master latch circuits, each of said master latch circuits having a data input, a clock input, and an output, where n is a positive integer;

a second group of one through n master latch circuits, each of said master latch circuits having a data input, a clock input and an output;

a group of one through n slave latch circuits, each of said slave latch circuits having a data input, clock input, and an output;

a first group of one through n AND circuits, each of said AND circuits of said first group having first and second inputs and an output;

a second group of one through n AND circuits, each of said AND circuits of said second group having first and second inputs and an output;

a shift register latch circuit means input, said shift register latch circuit means input being connected to said data input of said first master latch circuit of each of said first and second groups of master latch circuits;

a shift register latch circuit means output, said shift register latch circuit means output being connected to said output of said nth slave latch circuit of said one through n slave latch circuits;

first connection means, said first connection means respectively connecting the outputs of said first through the n-1th slave latch circuits, singly in the order designated, to each of said data inputs of said second through nth master latch circuits of said first group of master latch circuits, and singly in the order designated, to each of said data inputs of said second through nth master latch circuits of said second group of master latch circuits;

second connection means, said second connection means respectively connecting the outputs of said first through nth master latch circuits of said first group of master latch circuits, singly in the order designated, to the first input of said one through n AND circuits of said first group of AND circuits;

third connection means, said third connection means respectively connecting the outputs of said first through nth master latch circuits of said second group of master latch circuits, singly in the order designated, to the first input of said one through n AND circuits of said second group of AND circuits;

fourth connection means, said fourth connection means respectively connecting the first through nth outputs of said first group of AND circuits, singly in the order designated, to the data inputs of said first through nth slave latch circuits;

fifth connection means, said fifth connection means respectively connecting the first through nth outputs of said second group of AND circuits, singly in the order designated, to the data inputs of said first through nth slave latch circuits;

a first source of clock A pulses;

a second source of clock B pulses;

a control signal source for providing a control signal;

controllable circuit means connected to said first and second clock pulse sources and said control signal source, said controllable circuit means being connected to said clock inputs of said first through nth master latch circuits of said first and second groups of master circuit latch circuits, said clock inputs of said first through nth slave latch circuits and said second inputs of said first through nth AND circuits of said first and second groups of AND circuits.

3. In an integrated circuit device, test circuitry means for at least assisting in the testing of said integrated circuit device, said test circuit means comprising shift register latch circuit means, as recited in claim 2, wherein said controllable circuit means consists essentially of logical circuit means, said logical circuit means in response to said control signal providing a first output manifestation, or a second output manifestation, whereby in response to said first output manifestation said first group of master latch circuits and said group of slave latch circuits are interconnected to function as a first shift register having an input, an output and n shift register latch stages, and in response to said second output manifestation, said second group of master latch circuits and said group of slave latch circuits are interconnected to function as a second shift register having an input an output and n shift register latch stages.

4. In an integrated circuit device, test circuitry means for at least assisting in the testing of said integrated circuit device, said test circuit means comprising shift register latch circuit means, as recited in claim 3, wherein in response to said first output manifestation of said controllable circuit means, said clock pulses from said first source of clock A pulses are impressed on said clock inputs of said first group of master latch circuits and said B clock pulses of said second source of clock pulses are impressed on said second inputs of said AND circuits of said first group of AND circuits.

5. In an integrated circuit device, test circuitry means for at least assisting in the testing of said integrated circuit device, said test circuit means comprising shift register latch circuit means, as recited in claim 3, wherein in response to said second output manifestation of said controllable circuit means, said clock pulses from said first source of clock A pulses are impressed on said clock inputs of said second group of master latch circuits and said clock pulses of said second source of clock B pulses are impressed on said second inputs of said AND circuits of said second group of AND circuits.

* * * * *